US012771374B2

(12) United States Patent
Huang

(10) Patent No.: US 12,771,374 B2
(45) Date of Patent: Oct. 20, 2026

(54) TIME-INTERLEAVED ANALOG-TO-DIGITAL CONVERTER AND OPERATION METHOD THEREOF

(71) Applicant: REALTEK SEMICONDUCTOR CORPORATION, Hsinchu (TW)

(72) Inventor: Shih-Hsiung Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 126 days.

(21) Appl. No.: 18/974,201

(22) Filed: Dec. 9, 2024

(65) Prior Publication Data

US 2025/0226836 A1 Jul. 10, 2025

(51) Int. Cl.
*H03M 1/50* (2006.01)
*H03M 1/12* (2006.01)

(52) U.S. Cl.
CPC ........... *H03M 1/50* (2013.01); *H03M 1/1215* (2013.01)

(58) Field of Classification Search
CPC ............................. H03M 1/50; H03M 1/1215
USPC ......................................... 341/155, 163, 166
See application file for complete search history.

(56) References Cited

U.S. PATENT DOCUMENTS 9,294,112 B1 * 3/2016 Devarajan ........... H03M 1/0836
10,833,693 B2 * 11/2020 Björk ................. H03M 1/1038
2007/0262895 A1 11/2007 Stein
2023/0163770 A1 5/2023 Huang

OTHER PUBLICATIONS

OA letter of a counterpart TW application (appl. No. 113100611) mailed on Sep. 27, 2024.
Vogel, "The Impact of Combined Channel Mismatch Effects in Time-Interleaved ADCs", Feb. 2005, IEEE.
Vaz et al. "Session 16 Gigahertz Data Converters" 2017, ISSCC, IEEE.
Liu et al. "A 10-bit 50-MSs SAR ADC With a Monotonic Capacitor Switching Procedure", Apr. 2010, IEEE.

* cited by examiner

*Primary Examiner* — Khai M Nguyen
(74) *Attorney, Agent, or Firm* — WPAT, PC

(57) ABSTRACT

A method of operating a time-interleaved analog-to-digital converter (TIADC). The TIADC converts an input signal to generate a digital output signal and includes multiple asynchronous sub-ADCs. The asynchronous sub-ADCs each convert the input signal at a different time point to generate a digital output code, and each of the asynchronous sub-ADCs generates a completion signal upon completion of an analog-to-digital conversion operation. The method includes the following steps: generating an indication signal according to the completion signals, wherein the indication signal indicates multiple candidate sub-ADCs; selecting one of the candidate sub-ADCs as a target sub-ADC according to the indication signal; and correcting the digital output code of the target sub-ADC to generate the digital output signal.

18 Claims, 7 Drawing Sheets

| time point | … | t_s | t_s+1 | t_s+2 | t_s+3 | t_s+4 | t_s+5 | t_s+6 |
|---|---|---|---|---|---|---|---|---|
| candidate sub-ADC | … | 110_1/ 110_4 | 110_1/ 110_2 | 110_1/ 110_3 | 110_3/ 110_4 | 110_4/ 110_1 | 110_4/ 110_2 | 110_2/ 110_3 |
| target sub-ADC | … | 110_4 | 110_2 | 110_1 | 110_3 | 110_1 | 110_4 | 110_2 |

| time point | t_s+7 | t_s+8 | t_s+9 | t_s+10 | t_s+11 | t_s+12 | t_s+13 | … |
|---|---|---|---|---|---|---|---|---|
| candidate sub-ADC | 110_3/ 110_4 | 110_3/ 110_1 | 110_1/ 110_2 | 110_1/ 110_3 | 110_3/ 110_4 | 110_3/ 110_1 | 110_3/ 110_2 | … |
| target sub-ADC | 110_4 | 110_3 | 110_2 | 110_1 | 110_4 | 110_1 | 110_3 | … |

FIG. 3

TIME-INTERLEAVED ANALOG-TO-DIGITAL CONVERTER AND OPERATION METHOD THEREOF

BACKGROUND OF THE INVENTION

1. Field of the Invention

The present invention generally relates to an analog-to-digital converter (ADC), and, more particularly, to a time-interleaved ADC (TIADC) and its operation method.

2. Description of Related Art

The time-interleaved analog-to-digital converter (TIADC) includes multiple sub-ADCs, each of which samples the input signal according to sampling clocks that have the same frequency but different phases, and alternately generates its own digital output code as the output of the TIADC. For example, when the TIADC includes four sub-ADCs (for instance, ADC1, ADC2, ADC3, and ADC4), the four sub-ADCs sample the input signal according to the operation sequence of ADC1→ADC2→ADC3→ADC4→ADC1→ADC2→ . . . . However, the TIADC often encounters timing skew tone caused by sampling timing skew.

One method to suppress the timing skew tone is to add an additional sub-ADC to disrupt the aforementioned operation sequence. The operating principle of this suppression method is well known to people having ordinary skill in the art, so further elaboration is omitted for brevity. However, the disadvantage of this suppression method is that it is necessary to add an additional sub-ADC, resulting in an increase in circuit area and cost.

SUMMARY OF THE INVENTION

In view of the issues of the prior art, an object of the present invention is to provide a time-interleaved analog-to-digital converter (TIADC) and its operation method, so as to make an improvement to the prior art.

According to one aspect of the present invention, a TIADC is provided. The TIADC is configured to convert an input signal to generate a digital output signal. The TIADC includes an analog-to-digital converter (ADC) group, a control circuit, a sub-ADC selection circuit, and a digital code correction and selection circuit. The ADC group includes a plurality of asynchronous sub-ADCs. The plurality of asynchronous sub-ADCs converts the input signal at different time points to respectively generate a digital output code, and the plurality of asynchronous sub-ADCs each generates a completion signal upon completing one analog-to-digital conversion operation. The control circuit is coupled to the ADC group to generate an indication signal according to the completion signals. The indication signal indicates a plurality of candidate sub-ADCs. The sub-ADC selection circuit is coupled to the ADC group and the control circuit and configured to select one of the plurality of candidate sub-ADCs as a target sub-ADC according to the indication signal. The digital code correction and selection circuit is coupled to the ADC group to correct the digital output code of the target sub-ADC to generate the digital output signal.

According to another aspect of the present invention, a method of operating a TIADC is provided. The TIADC is configured to convert an input signal to generate a digital output signal and includes a plurality of asynchronous sub-ADCs. The plurality of asynchronous sub-ADCs converts the input signal at different time points to respectively generate a digital output code, and the plurality of asynchronous sub-ADCs each generates a completion signal upon completing one analog-to-digital conversion operation. The method includes the following steps: generating an indication signal according to the completion signals, wherein the indication signal indicates a plurality of candidate sub-ADCs; selecting one of the plurality of candidate sub-ADCs as a target sub-ADC according to the indication signal; and correcting the digital output code of the target sub-ADC to generate the digital output signal.

The technical means embodied in the embodiments of the present invention can solve at least one of the problems of the prior art. Therefore, compared to the prior art, the present invention can save circuit area and reduce costs compared to prior art.

These and other objectives of the present invention no doubt become obvious to those of ordinary skill in the art after reading the following detailed description of the preferred embodiments with reference to the various figures and drawings.

BRIEF DESCRIPTION OF THE DRAWINGS

FIG. 3 is a schematic diagram of the candidate sub-ADC and the target sub-ADC according to an embodiment of the present invention.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes a time-interleaved analog-to-digital converter (TIADC) and its operation method. On account of that some or all elements of the TIADC could be known, the detail of such elements is omitted provided that such detail has little to do with the features of this disclosure, and that this omission nowhere dissatisfies the specification and enablement requirements. Some or all of the processes of the method of operating a TIADC may be implemented by software and/or firmware and can be performed by the TIADC or its equivalent. A person having ordinary skill in the art can choose components or steps equivalent to those described in this specification to carry out the present invention, which means that the scope of this invention is not limited to the embodiments in the specification.

Figure 1:
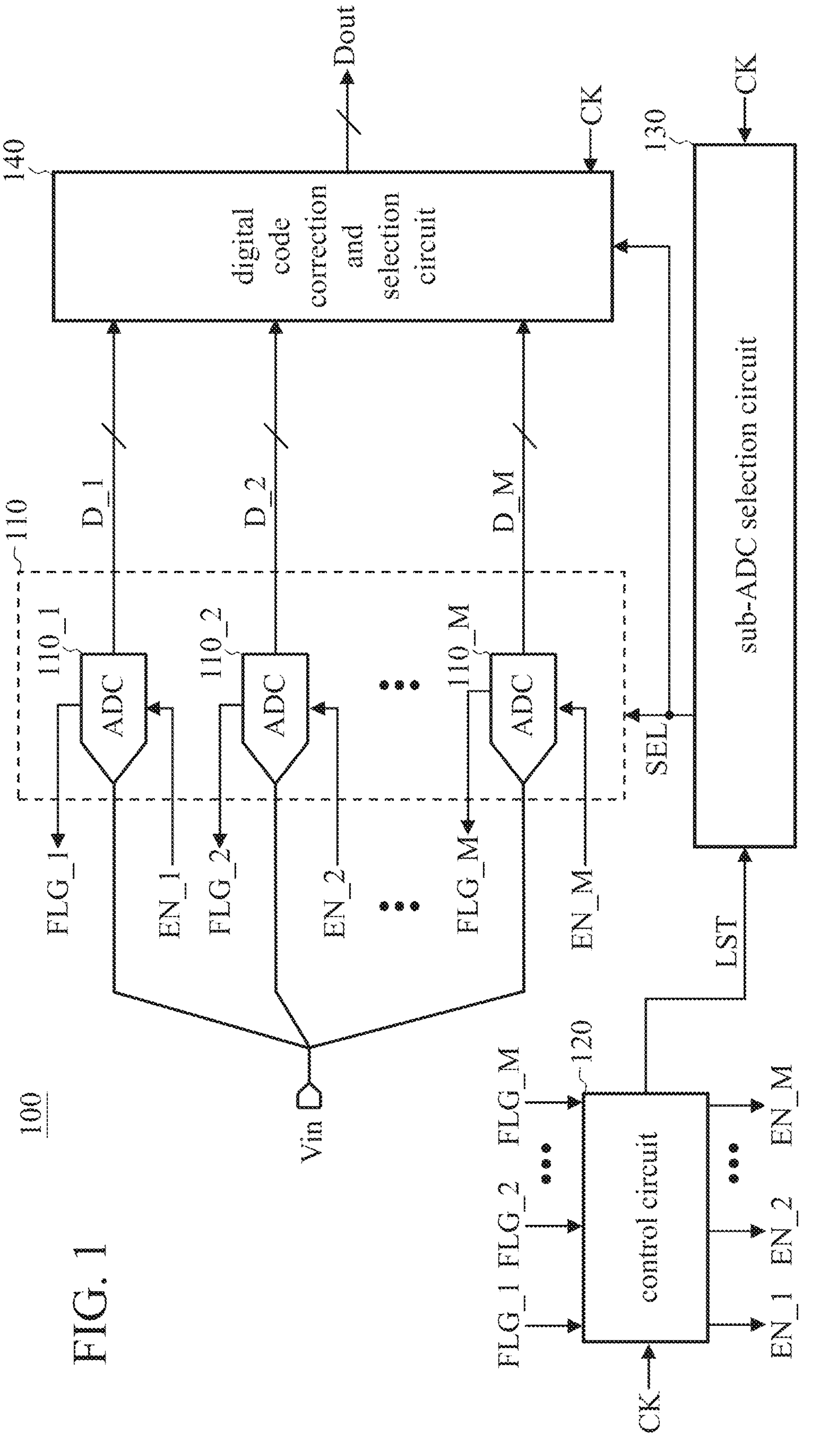
FIG. 1 is the functional block diagram of the time-interleaved analog-to-digital converter (TIADC) according to an embodiment of the present invention.

FIG. 1 is the functional block diagram of the time-interleaved analog-to-digital converter (TIADC) according to an embodiment of the present invention. The time-interleaved analog-to-digital converter (TIADC) 100 includes an ADC group 110, a control circuit 120, a sub-ADC selection circuit 130, and a digital code correction and selection circuit 140 that are coupled to each other.

The ADC group 110 includes M sub-ADCs (including the sub-ADC 110_1, the sub-ADC 110_2, . . . , the sub-ADC 110_M, where M is an integer greater than or equal to 3). The sub-ADC 110_1 samples the input signal Vin and generates the digital output code D_1 and the completion signal FLG_1. The sub-ADC 110_2 samples the input signal Vin and generates the digital output code D_2 and the completion signal FLG_2. The sub-ADC 110_M samples the input signal Vin and generates the digital output code D_M and the completion signal FLG_M. The completion signal FLG_K indicates that the sub-ADC 110_K has completed a certain analog-to-digital conversion operation (i.e., the least significant bit (LSB) of the digital output code D_K has been generated) (1≤K≤M). More specifically, in some embodiments, when generating the digital output code D_K's LSB, the sub-ADC 110_K changes the value or level of the completion signal FLG_K (e.g., from a low level to a high level).

The ADC group 110 contains asynchronous ADCs, which means that the time required for each sub-ADC (110_1, 110_2, . . . , 110_M) to perform an analog-to-digital conversion operation is not fixed. Therefore, although the sub-ADC 110_K is allocated a preset time (e.g., a fixed duration) for performing the analog-to-digital conversion operation, when the sub-ADC 110_K completes the analog-to-digital conversion operation ahead of schedule, the sub-ADC 110_K experiences a longer idle (i.e., non-operational) period.

In some embodiments, each sub-ADC (110_1, 110_2, . . . , 110_M) operates according to its respective control signal (the control signals EN_1, EN_2, . . . , EN_M). The control signals are generated by the control circuit 120. The control signals are optional and will be detailed below.

Figure 2:
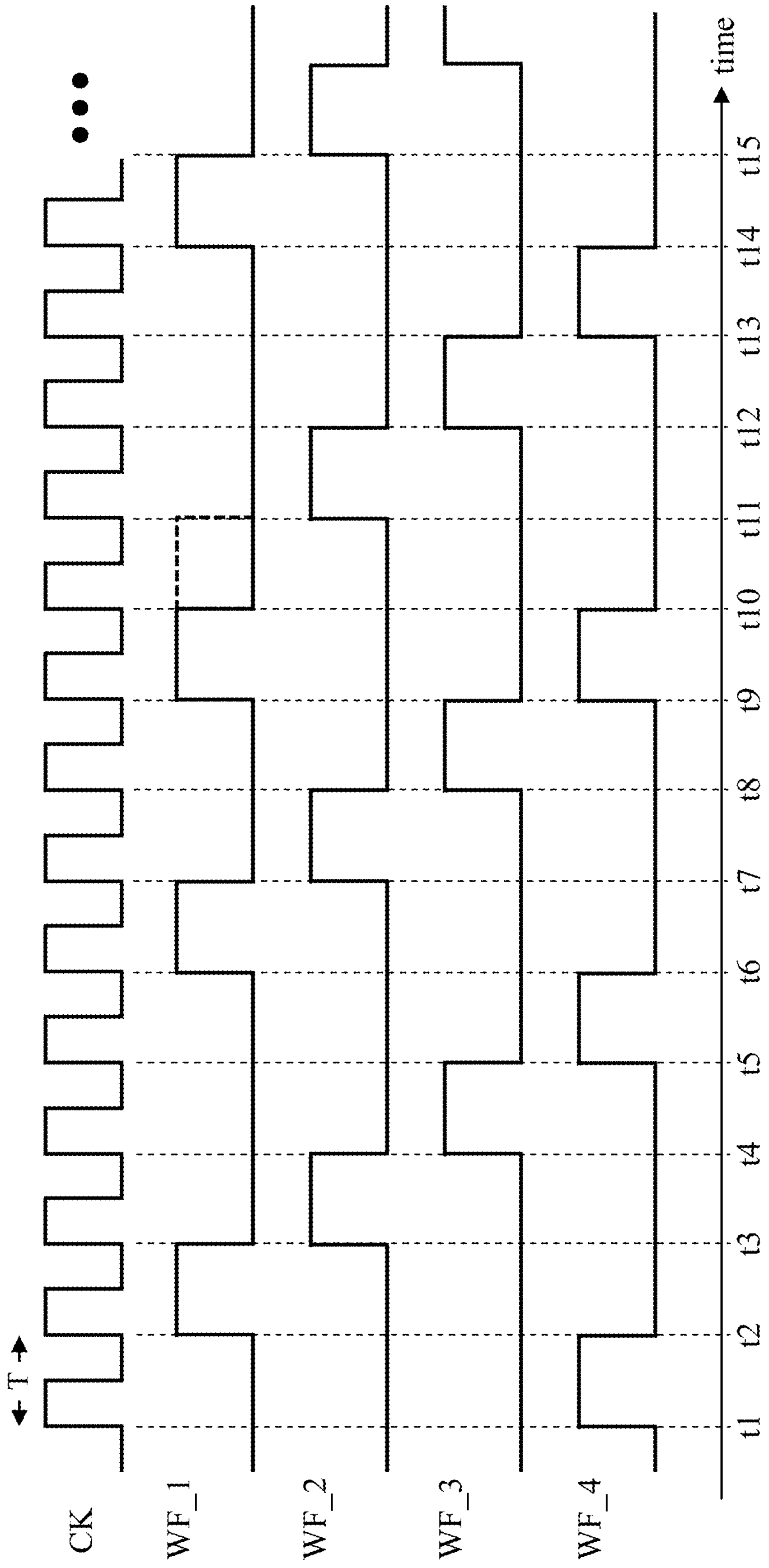
FIG. 2 illustrates the waveforms of the operational timing sequence for the sub-ADCs according to an embodiment of the present invention.

The control circuit 120 generates the indication signal LST based on the completion signals (FLG_1, FLG_2, . . . , FLG_M). The indication signal LST indicates the candidate sub-ADC(s) (i.e., the idle sub-ADC(s), which is/are not currently in operation, that is, the sub-ADC(s) that has/have already completed the analog-to-digital conversion operation). Reference is made to FIG. 2, which illustrates the waveforms of the operational timing sequence for the sub-ADCs according to an embodiment of the present invention. The operating clock CK (with a period T) is the operating clock of the TIADC 100. In the example of FIG. 2, M is 4. The operation waveform WF_1, the operation waveform WF_2, the operation waveform WF_3, and the operation waveform WF_4 correspond to the sub-ADC 110_1, the sub-ADC 110_2, the sub-ADC 110_3, and the sub-ADC 110_4, respectively. In the example of FIG. 2, the ADC performs sampling operation when the operation waveform is at a high level, and the ADC performs analog-to-digital conversion operation when the operation waveform is at a low level. For example, the sub-ADC 110_2 performs sampling operations between the time point t3 and the time point t4, between the time point t7 and the time point t8, and between the time point t11 and the time point t12, as well as performs analog-to-digital conversion operations between the time point t4 and the time point t7, between the time point t8 and the time point t11, and between the time point t12 and the time point t15.

As shown in FIG. 2, when no sub-ADC terminates the analog-to-digital conversion operation (e.g., between the time point t1 and the time point t6) ahead of schedule, the control circuit 120 uses the indication signal LST to inform the sub-ADC selection circuit 130 that there is only one candidate sub-ADC at a time (the candidate sub-ADCs between the time point t2 and the time point t6 are sequentially: the sub-ADCs 110_1, 110_2, 110_3, and 110_4, which sequentially generate the digital output codes D_1, D_2, D_3, and D_4, respectively). Assuming that the sub-ADC 110_1 completes the analog-to-digital conversion operation corresponding to the interval between the time point t7 and the time point t10 ahead of schedule (i.e., from the time point t10 to the time point t9, as indicated by the dashed line), the sub-ADC 110_1 may be considered a candidate ADC at the time point t9 (i.e., it may be selected as the target sub-ADC by the sub-ADC selection circuit 130). That is to say, at the time point t9, the indication signal LST includes the sub-ADC 110_1 and the sub-ADC 110_4.

Reference is made back to FIG. 1. The sub-ADC selection circuit 130 generates the selection signal SEL in a pseudo random manner according to the indication signal LST, selecting one of the candidate sub-ADCs indicated by the indication signal LST to serve as the target sub-ADC. In the example of FIG. 2, the sub-ADC selection circuit 130 may select the sub-ADC 110_1 or the sub-ADC 110_4 at the time point t9 to serve as the target sub-ADC.

The digital code correction and selection circuit 140 selects and corrects the output of the target sub-ADC based on the selection signal SEL to serve as the digital output signal Dout. The digital code correction and selection circuit 140 corrects the skew tone, gain tone, and offset tone generated by the mismatch in the ADC group 110. In some embodiments, the digital code correction and selection circuit 140 includes multiple filters, and the digital code correction and selection circuit 140 improves its correction performance by adjusting the coefficients of these filters. The adjustment or correction of digital output codes using a filter is well known to people having ordinary skill in the art; further elaboration is omitted for brevity.

Reference is made to FIG. 3, which is a schematic diagram of the candidate sub-ADC and the target sub-ADC according to an embodiment of the present invention. At the time point t_s (e.g., at the time point t9 in FIG. 2), the indication signal LST indicates that the candidate sub-ADCs include the sub-ADC 110_1 and the sub-ADC 110_4, the target sub-ADC (i.e., the sub-ADC selected by the sub-ADC selection circuit 130) is the sub-ADC 110_4, and the unselected sub-ADC 110_1 may continue to be a candidate sub-ADC at the next time point t_s+1; at the time point t_s+1, the indication signal LST indicates that the candidate sub-ADC includes the sub-ADC 110_1 and the sub-ADC 110_2, and the target sub-ADC is the sub-ADC 110_2; at the time point t_s+2, the indication signal LST indicates that the candidate sub-ADC includes the sub-ADC 110_1 and the sub-ADC 110_3, and the target sub-ADC is the sub-ADC 110_1; and so forth. Over a long period, the digital output signal Dout presents a random pattern (e.g., corresponding to the example in FIG. 3, Dout= . . . →D_4→D_2→D_1→D_3→D_1→D_4→D_2→D_4→D_3→

D_2→D_1→D_4→D_1→D_3→ . . . ), rather than a fixed pattern (e.g., D_1→D_2→D_3→D_4→D_1→D_2→ D_3→D_4→D_1→ . . . ). This is equivalent to the sub-ADC selection circuit 130 randomly outputting M digital output codes (in the examples of FIG. 2 and FIG. 3, M is 4) as the digital output signal Dout. The random digital output signal Dout helps to suppress timing skew tones and improve the quality of the TIADC 100. The implementation of pseudo random is well known to people having ordinary skill in the art; further elaboration is omitted for brevity.

Figure 4:
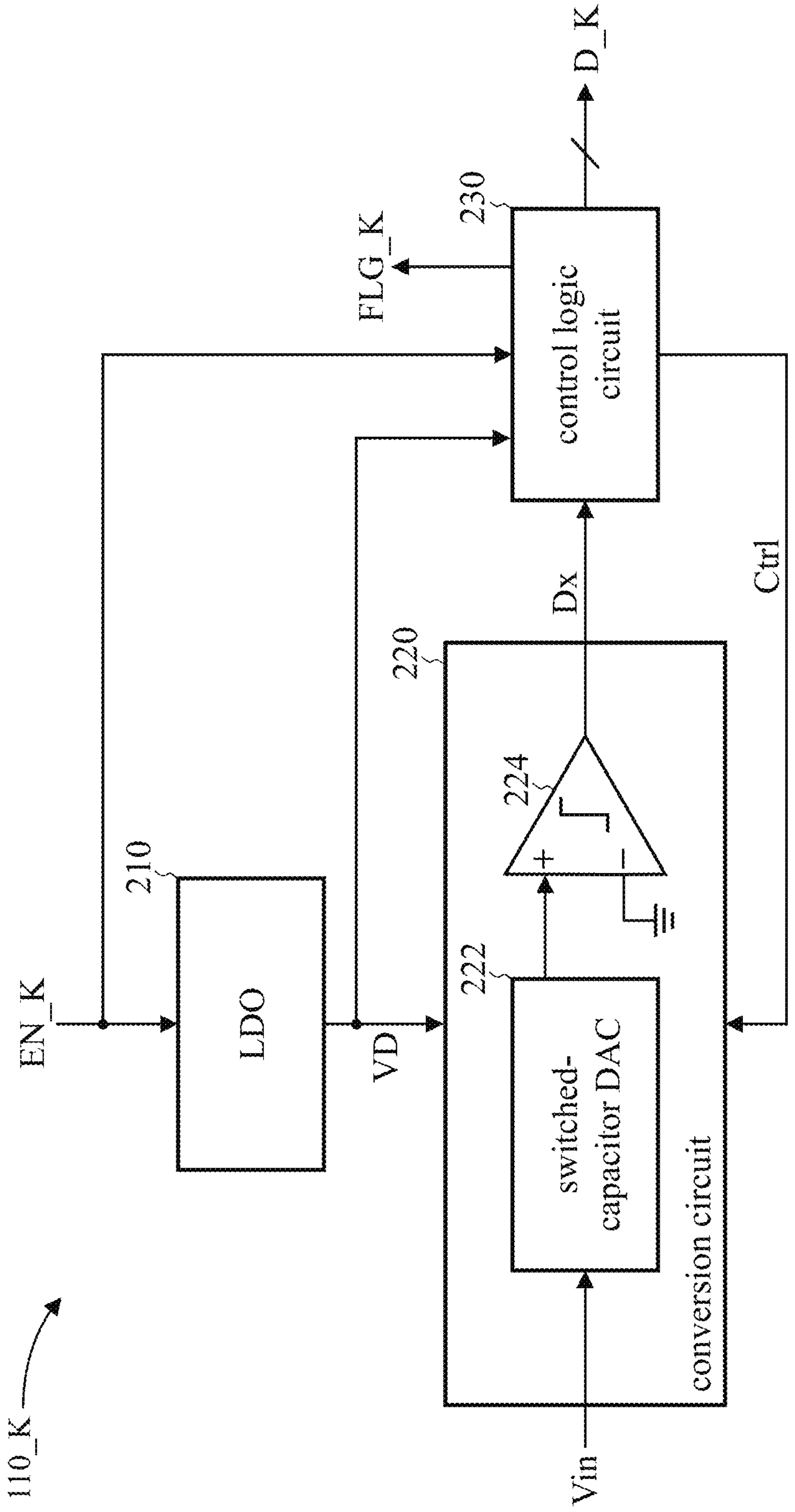
FIG. 4 is the functional block diagram of the sub-ADC according to an embodiment of the present invention.

Reference is made to FIG. 4, which is a functional block diagram of the sub-ADC according to an embodiment of the present invention. The sub-ADC 110_K includes a low-dropout regulator (LDO) 210, a conversion circuit 220, and a control logic circuit 230 that are coupled to each other. The LDO 210 provides the operating voltage VD to the conversion circuit 220 and the control logic circuit 230. The conversion circuit 220, controlled by the control signal Ctrl from the control logic circuit 230, converts the input signal Vin into an intermediate digital code Dx. The control logic circuit 230 generates the control signal Ctrl based on its built-in counter and generates the digital output code D_K based on multiple intermediate digital codes Dx. The analog-to-digital conversion operation of the sub-ADC 110_K (or the conversion circuit 220) may refer to the operation in which the sub-ADC 110_K (or the conversion circuit 220) determines all bits of the digital output code D_K.

The control signal EN_K may be used to accelerate the sub-ADC 110_K (i.e., to terminate a certain analog-to-digital conversion operation of the sub-ADC 110_K ahead of schedule) to ensure that the sub-ADC 110_K qualifies as a candidate sub-ADC. The following provides two implementation examples: (1) adjusting the operating voltage VD by controlling the LDO 210; and/or (2) by controlling the control logic circuit 230 to omit the LSB of the digital output code D_K (e.g., by setting the LSB of the digital output code D_K to a preset value (e.g., 0)).

Embodiment (1)

When the operating voltage VD is increased (e.g., to 1.1 to 1.2 times the normal operating voltage), the conversion circuit 220 generates the intermediate digital code Dx more rapidly, and the control logic circuit 230 generates the digital output code D_K more rapidly, allowing the sub-ADC 110_K to terminate a certain analog-to-digital conversion operation ahead of schedule. Methods to increase the operating voltage VD include but are not limited to increasing the reference voltage of the LDO 210 and/or adjusting the resistance value of the feedback resistor of the LDO 210. Adjusting the reference voltage and/or the resistance value of the feedback resistor of the LDO 210 is well known to people having ordinary skill in the art, and therefore further elaboration is omitted for brevity. In some embodiments, the conversion circuit 220 includes a comparator 224 (e.g., the sub-ADC 110_K is an asynchronous successive-approximation register (SAR) analog-to-digital converter (ADC) (hereinafter referred to as SAR ADC)); when the operating voltage VD is increased, the comparator 224 generates comparison results more rapidly.

Embodiment (2)

Assuming the digital output code D_K is 12 bits, the control logic circuit 230 may terminate the analog-to-digital conversion operation ahead of schedule by setting the $12^{th}$ bit to a preset value after obtaining the first 11 bits. Alternatively, the control logic circuit 230 may terminate the analog-to-digital conversion operation ahead of schedule by setting the $11^{th}$ and $12^{th}$ bits to the preset value after obtaining the first 10 bits.

When the sub-ADC 110_K is an asynchronous SAR ADC, the conversion circuit 220 includes a switched-capacitor DAC 222 and a comparator 224, and the control logic circuit 230 includes a successive-approximation register and logic circuits (not shown). The operating voltage VD may serve as the power supply voltage for the comparator 224 and the logic circuits. The control logic circuit 230 uses the control signal Ctrl to turn on or off multiple switches in the switched-capacitor DAC 222 according to the current intermediate digital code Dx, thereby generating the next intermediate digital code Dx. When the control logic circuit 230 has determined all bits of the digital output code D_K, the control logic circuit 230 issues the completion signal FLG_K. The control logic circuit 230 may terminate the switching of the switched-capacitor DAC 222 in the conversion circuit 220 ahead of schedule according to the control signal EN_K (e.g., by skipping the capacitor with the minimum capacitance value). It should be noted that the asynchronous SAR ADC is used for illustrative purposes only; the sub-ADC 110_K may be other types of ADCs, such as the asynchronous pipeline ADC (also referred to as pipelined ADC).

Reference is made to FIG. 1. The control circuit 120 may accelerate R sub-ADC(s) simultaneously through the control signals (where R is an integer greater than or equal to 1). When R is 1, the control circuit 120 ensures that there are at least 2 candidate sub-ADCs each time (as shown in the example of FIG. 3, the 2 candidate sub-ADCs may be the accelerated sub-ADC 110_1 and the originally scheduled sub-ADC 110_4); when R is 2, the control circuit 120 ensures that there are at least 3 candidate sub-ADCs each time; when R is 3, the control circuit 120 ensures that there are at least 4 candidate sub-ADCs each time; and so forth. The greater the number of candidate sub-ADCs, the more effective the pseudo random effect of the sub-ADC selection circuit 130 becomes (i.e., the better the suppression of timing skew tone).

Figure 5:
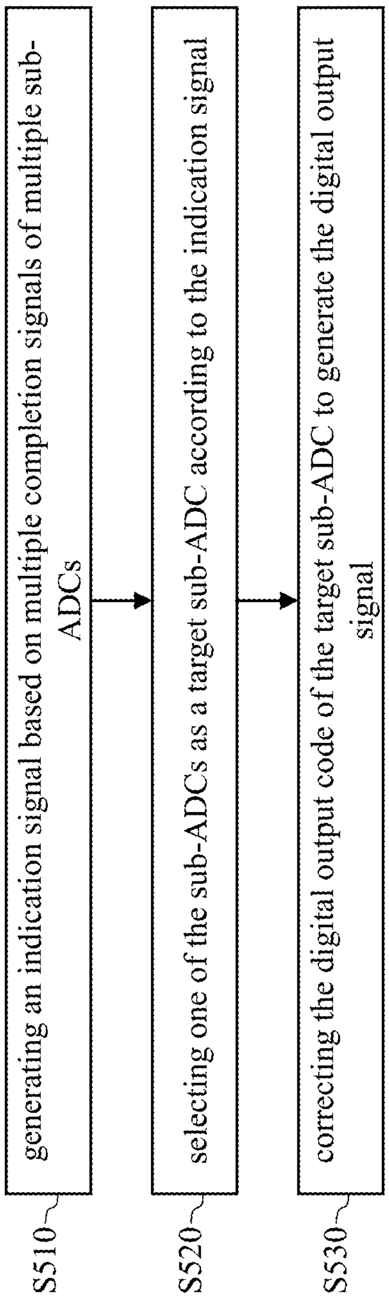
FIG. 5 is a flowchart of the operation method of the TIADC according to an embodiment of the present invention.

In addition to the aforementioned TIADC, the invention also correspondingly provides an operation method of a TIADC. This method can be executed by the aforementioned TIADC 100 or its equivalent device. FIG. 5 is a flowchart of the operation method of the TIADC according to an embodiment of the present invention, which includes the following steps.

Step S510: Generating the indication signal LST based on the multiple completion signals (FLG_1, FLG_2, . . . , FLG_M) of the multiple sub-ADCs (110_1, 110_2, . . . , 110_M). In some embodiments, step S510 may be executed by the control circuit 120. In the example of FIG. 2, the control circuit 120 adds the sub-ADC 110_1 and the sub-ADC 110_4 to the candidate sub-ADCs based on the completion signal FLG_1 of the sub-ADC 110_1 and the completion signal FLG_4 of the sub-ADC 110_4 (for example, this may correspond to the time point t_s in FIG. 3).

Step S520: Selecting one of the sub-ADCs as the target sub-ADC (e.g., sub-ADC 110_K) according to the indication signal LST. In some embodiments, step S520 may be executed by the sub-ADC selection circuit 130.

Step S530: Correcting the digital output code (e.g., the digital output code D_K) of the target sub-ADC to generate the digital output signal Dout. In some embodiments, step S530 may be executed by the digital code correction and selection circuit 140.

Figure 6:
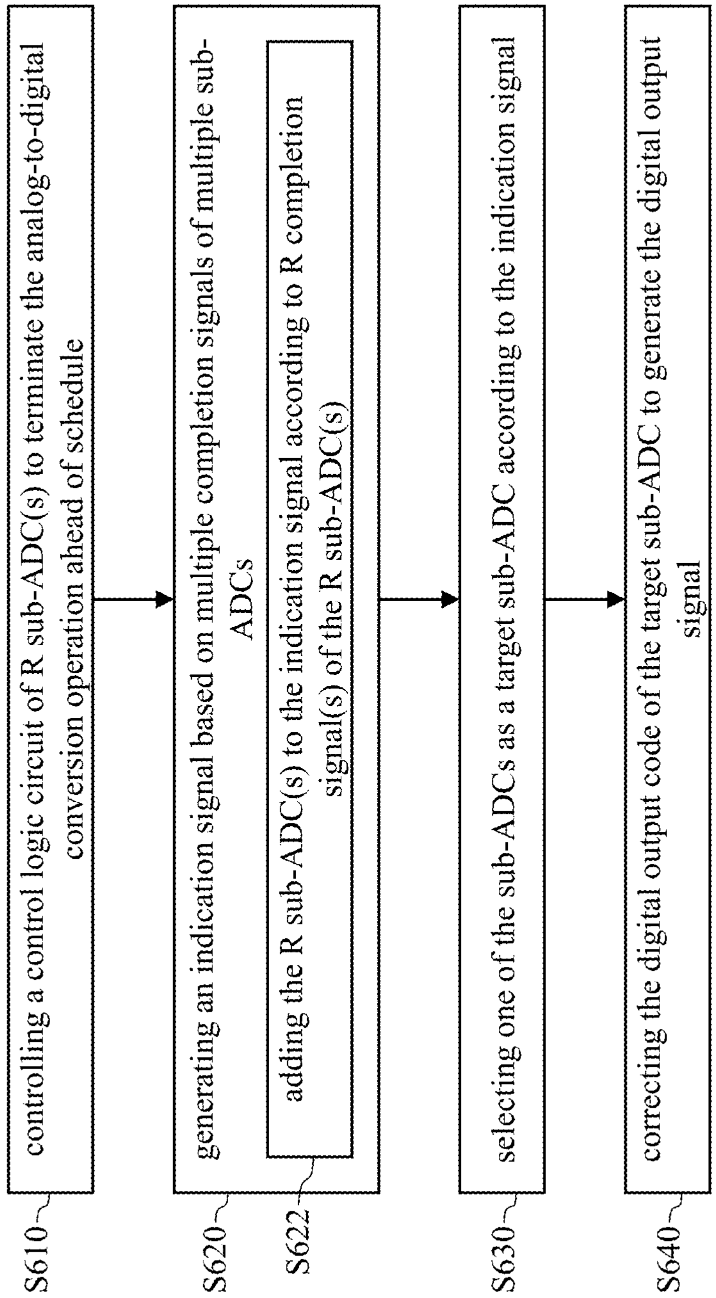
FIG. 6 is a flowchart of the operation method of the TIADC according to another embodiment of the present invention.

FIG. 6 is a flowchart of the operation method of the TIADC according to another embodiment of the present invention, which includes the following steps.

Step S610: Controlling the control logic circuit 230 of the R sub-ADC(s) to terminate the analog-to-digital conversion operation ahead of schedule (which is equivalent to accelerating the R sub-ADC(s)). In some embodiments, step S610 may be executed by the control circuit 120.

Step S620: Generating the indication signal LST based on multiple completion signals of multiple sub-ADCs. Similar to step S510, in some embodiments, step S620 may be executed by the control circuit 120. Step S620 further includes sub-step S622.

Step S622: Adding the R sub-ADC(s) to the indication signal according to the R completion signal(s) of the R sub-ADC(s), so that the R sub-ADC(s) become(s) a subset of multiple candidate sub-ADCs. For example, in the example of FIG. 2, R is 1, and the control circuit 120 adds the sub-ADC 110_1 to the indication signal LST according to the completion signal FLG_1 of the sub-ADC 110_1.

Step S630: Selecting one of the sub-ADCs as the target sub-ADC according to the indication signal LST. Step S630 and step S520 are substantially the same.

Step S640: Correcting the digital output code of the target sub-ADC to generate the digital output signal Dout. Step S640 and step S530 are substantially the same.

Figure 7:
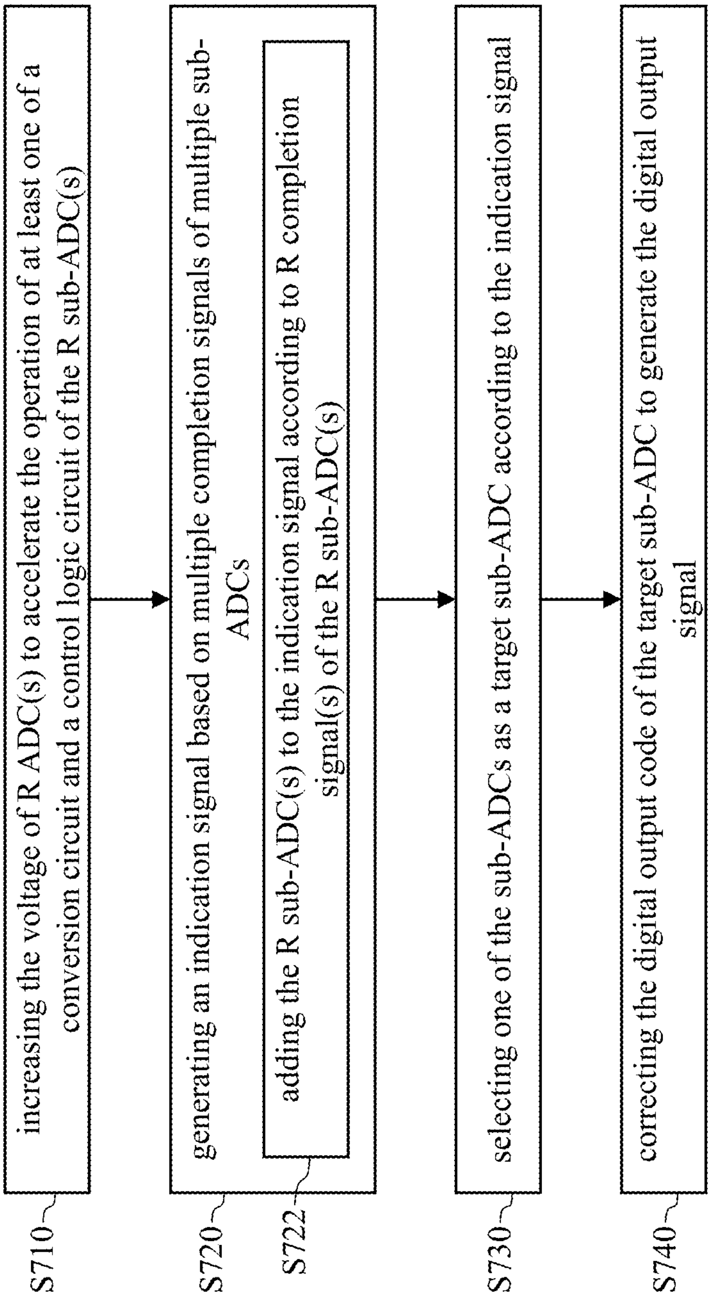
FIG. 7 is a flowchart of the operation method of the TIADC according to another embodiment of the present invention.

FIG. 7 is a flowchart of the operation method of the TIADC according to another embodiment of the present invention, which includes the following steps.

Step S710: Increasing the operating voltage VD of the R ADC(s) to accelerate the operation of the R sub-ADC(s) (e.g., by accelerating the conversion circuit 220 and/or the control logic circuit 230). In some embodiments, step S710 may be executed by the control circuit 120, for example, by increasing the reference voltage of the LDO 210 of the R sub-ADC(s) and/or adjusting the resistance value of the feedback resistor of the LDO 210.

Steps S720, S722, S730, and S740 are substantially the same as steps S620, S622, S630, and S640; further elaboration is omitted for brevity.

In some embodiments, R is 1 (as shown in the example of FIG. 3). In an alternative embodiment, R may be greater than or equal to 2 and less than M.

People having ordinary skill in the art may implement the control circuit 120 based on the above discussion using logic gates or a logic circuit.

In summary, the invention can suppress timing skew tone based on a random operation method without the need for an additional sub-ADC. Therefore, this disclosure saves circuit area and reduces costs compared to prior art.

Since a person having ordinary skill in the art can appreciate the implementation detail and the modification thereto of the present method invention through the disclosure of the device invention, repeated and redundant description is thus omitted. Note that the shape, size, and ratio of any element in the disclosed figures are exemplary for understanding, not for limiting the scope of this invention. Furthermore, there is no step sequence limitation for the method inventions as long as the execution of each step is applicable. In some instances, the steps can be performed simultaneously or partially simultaneously.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A time-interleaved analog-to-digital converter (TIADC) configured to convert an input signal to generate a digital output signal, comprising:

an analog-to-digital converter (ADC) group comprising a plurality of asynchronous sub-ADCs, wherein the plurality of asynchronous sub-ADCs converts the input signal at different time points to respectively generate a digital output code, and the plurality of asynchronous sub-ADCs each generates a completion signal upon completing one analog-to-digital conversion operation;

a control circuit coupled to the ADC group to generate an indication signal according to the completion signals, wherein the indication signal indicates a plurality of candidate sub-ADCs;

a sub-ADC selection circuit coupled to the ADC group and the control circuit and configured to select one of the plurality of candidate sub-ADCs as a target sub-ADC according to the indication signal; and a digital code correction and selection circuit coupled to the ADC group to correct the digital output code of the target sub-ADC to generate the digital output signal.

2. The TIADC of claim 1, wherein the ADC group comprises a first sub-ADC and a second sub-ADC, the first sub-ADC and the second sub-ADC respectively generate a first completion signal and a second completion signal, the control circuit adds the first sub-ADC and the second sub-ADC to the plurality of candidate sub-ADCs according to the first completion signal and the second completion signal.

3. The TIADC of claim 2, wherein the first sub-ADC comprises:

a conversion circuit configured to perform an analog-to-digital conversion operation to convert the input signal into an intermediate digital code; and a control logic circuit coupled to the conversion circuit and the control circuit and configured to control the analog-to-digital conversion operation of the conversion circuit and generate the digital output code according to the intermediate digital code;

wherein the control circuit further controls the control logic circuit of the first sub-ADC to terminate the analog-to-digital conversion operation ahead of schedule, so that the first sub-ADC becomes one of the plurality of candidate sub-ADCs.

4. The TIADC of claim 2, wherein the first sub-ADC comprises:

a low-dropout regulator configured to provide an operating voltage;

a conversion circuit coupled to the low-dropout regulator and configured to perform an analog-to-digital conversion operation to convert the input signal into an intermediate digital code; and a control logic circuit coupled to the low-dropout regulator and the conversion circuit and configured to control the analog-to-digital conversion operation of the conversion circuit and generate the digital output code according to the intermediate digital code;

wherein the control circuit further accelerates at least one of the conversion circuit and the control logic circuit by increasing the operating voltage of the low-dropout regulator of the first sub-ADC, so that the first sub-ADC becomes one of the plurality of candidate sub-ADCs.

5. The TIADC of claim 4, wherein the conversion circuit comprises a comparator, and the low-dropout regulator provides the operating voltage to the comparator.

6. The TIADC of claim 1, wherein each of the plurality of asynchronous sub-ADCs is an asynchronous successive-approximation register (SAR) ADC, and the asynchronous SAR ADC generates the completion signals when generating a least significant bit of the digital output code.

7. The TIADC of claim 1, wherein the control circuit accelerates R of the plurality of asynchronous sub-ADCs by increasing an operating voltage or omitting a least significant bit of the digital output code, so that the plurality of candidate sub-ADCs comprises the R sub-ADC(s), and R is an integer greater than or equal to 1.

8. The TIADC of claim 7, wherein R is 1.

9. The TIADC of claim 7, wherein R is 2.

10. A method of operating a time-interleaved analog-to-digital converter (TIADC), wherein the TIADC is configured to convert an input signal to generate a digital output signal and comprises a plurality of asynchronous sub-ADCs, the plurality of asynchronous sub-ADCs converts the input signal at different time points to respectively generate a digital output code, and the plurality of asynchronous sub-ADCs each generates a completion signal upon completing one analog-to-digital conversion operation, the method comprising:

generating an indication signal according to the completion signals, wherein the indication signal indicates a plurality of candidate sub-ADCs;

selecting one of the plurality of candidate sub-ADCs as a target sub-ADC according to the indication signal; and correcting the digital output code of the target sub-ADC to generate the digital output signal.

11. The method of claim 10, wherein the plurality of asynchronous sub-ADCs comprises a first sub-ADC and a second sub-ADC, the first sub-ADC and the second sub-ADC respectively generate a first completion signal and a second completion signal, step of generating the indication signal according to the completion signals involves adding the first sub-ADC and the second sub-ADC to the plurality of candidate sub-ADCs according to the first completion signal and the second completion signal.

12. The method of claim 11, wherein the first sub-ADC comprises a conversion circuit and a control logic circuit, the conversion circuit is configured to perform an analog-to-digital conversion operation to convert the input signal into an intermediate digital code, and the control logic circuit is configured to control the analog-to-digital conversion operation of the conversion circuit and generate the digital output code according to the intermediate digital code, the method further comprising:

controlling the control logic circuit of the first sub-ADC to terminate the analog-to-digital conversion operation ahead of schedule, so that the first sub-ADC becomes one of the plurality of candidate sub-ADCs.

13. The method of claim 11, wherein the first sub-ADC comprises a low-dropout regulator, a conversion circuit, and a control logic circuit, the low-dropout regulator is configured to provide an operating voltage, the conversion circuit is configured to perform an analog-to-digital conversion operation to convert the input signal into an intermediate digital code, and the control logic circuit is configured to control the analog-to-digital conversion operation of the conversion circuit and generate the digital output code according to the intermediate digital code, the method further comprising:

accelerating at least one of the conversion circuit and the control logic circuit by increasing the operating voltage of the low-dropout regulator of the first sub-ADC, so that the first sub-ADC becomes one of the plurality of candidate sub-ADCs.

14. The method of claim 13, wherein the conversion circuit comprises a comparator, and the low-dropout regulator provides the operating voltage to the comparator.

15. The method of claim 10, wherein each of the plurality of asynchronous sub-ADCs is an asynchronous successive-approximation register (SAR) ADC, and the completion signals indicate that the asynchronous SAR ADC has generated a least significant bit of the digital output code.

16. The method of claim 10 further comprising:

accelerating R of the plurality of asynchronous sub-ADCs by increasing an operating voltage or omitting a least significant bit of the digital output code, so that the plurality of candidate sub-ADCs comprises the R sub-ADC(s), and R is an integer greater than or equal to 1.

17. The method of claim 16, wherein R is 1.

18. The method of claim 16, wherein R is 2.

* * * * *